United States Patent [19]
Sugimoto et al.

[11] Patent Number: 5,591,264
[45] Date of Patent: Jan. 7, 1997

[54] SPIN COATING DEVICE

[75] Inventors: Emi Sugimoto, Tokyo; Akira Yoshio, Shizuoka; Yoshinori Ito, Tokyo, all of Japan

[73] Assignee: Sony Corporation, Japan

[21] Appl. No.: 405,133

[22] Filed: Mar. 16, 1995

[30] Foreign Application Priority Data

Mar. 22, 1994 [JP] Japan .................................... 6-075326
May 18, 1994 [JP] Japan .................................... 6-129571

[51] Int. Cl.$^6$ .................................................. B05B 13/00
[52] U.S. Cl. ............................ 118/320; 118/52; 118/501; 118/326
[58] Field of Search ............................ 118/320, 326, 118/52, 501

[56] References Cited

U.S. PATENT DOCUMENTS

| | | | |
|---|---|---|---|
| 4,315,705 | 2/1982 | Flint | 406/73 |
| 4,838,979 | 6/1989 | Nishida et al. | 156/345 |
| 4,856,456 | 8/1989 | Hillman et al. | 118/500 |
| 5,013,586 | 5/1991 | Cavazza | 427/240 |
| 5,096,156 | 12/1991 | Suzuki | 118/52 |
| 5,116,250 | 5/1992 | Sago et al. | 118/52 |
| 5,209,180 | 5/1993 | Shoda et al. | 118/52 |
| 5,234,499 | 8/1993 | Sasaki et al. | 118/52 |
| 5,415,691 | 5/1995 | Fujiyama et al. | 118/52 |

FOREIGN PATENT DOCUMENTS

| | | |
|---|---|---|
| 2122520 | 5/1990 | Japan . |
| 4303919 | 10/1992 | Japan . |
| 4369210 | 12/1992 | Japan . |
| 5109612 | 4/1993 | Japan . |
| 5114554 | 5/1993 | Japan . |

*Primary Examiner*—Jill Warden
*Assistant Examiner*—Sharidan Carrillo
*Attorney, Agent, or Firm*—Ronald P. Kananen

[57] ABSTRACT

A spin coating device for a substrate, in which a uniform thin film can be formed by applying an application liquid to a substrate and the quality of the substrate can be further improved. The spin coating device for a substrate comprises a turntable 2 for holding and rotating a substrate 1; an application liquid supply means 4 for supplying an application liquid 3 to the rotating substrate 1: splash preventing means 20, which are arranged at the periphery of the substrate 1 held by the turntable 2, prevent the droplets of the application liquid from splashing and provide with an opening portion 10 for circulating the flow A of external air in an area ranging from the central portion toward the peripheral portion of the substrate 1 held by the turntable 2. Exhaust means 8 and 9 for exhausting air from within the splash preventing means 20 are provided.

18 Claims, 3 Drawing Sheets

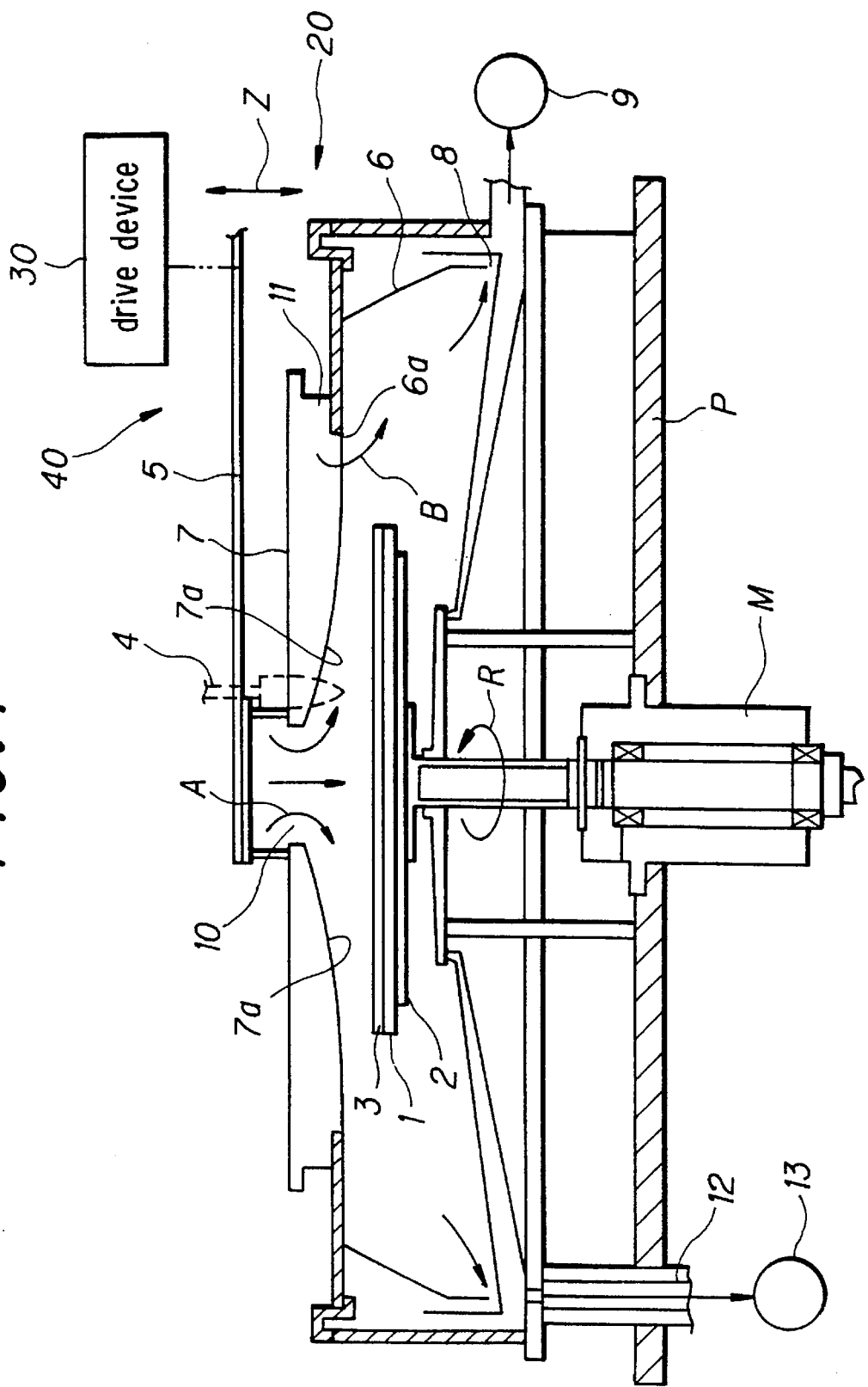

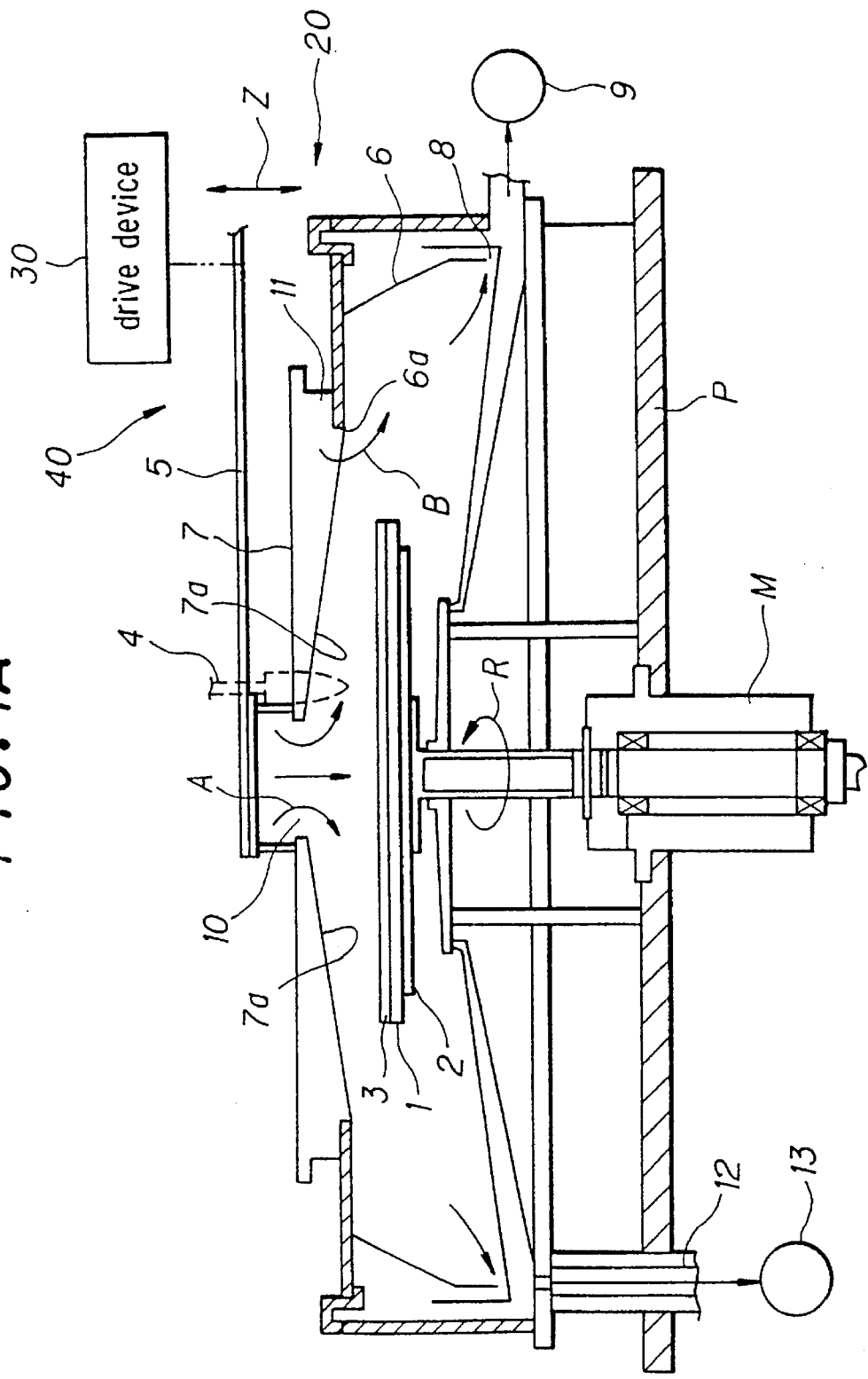

5,591,264

SPIN COATING DEVICE

BACKGROUND OF THE INVENTION

1. Field of the Invention

The present invention relates to an improved spin coating device for a substrate, and more particularly, to a spin coating device for a substrate designed to apply an application liquid onto a substrate rotated at high speed and to form a uniform thin film.

2. Description of the Prior Art

A rotary applicator of such a type as shown in FIG. 2, for example, has been generally known as a spin coating device in which a thin film of a uniform thickness is formed on a substrate by applying an application liquid of relatively low or medium viscosity on the substrate, while the substrate such as a semiconductor substrate is rotated at high speed.

A turntable 2 is used to hold and rotate a substrate above this turntable 2, an application liquid discharge nozzle 4 is arranged. This application liquid discharge nozzle 4 serves to supply an application liquid 3 to a rotating substrate 1.

A splash preventing cup 6 is provided in order to prevent the application liquid from splashing. A splash preventing cover 7 is provided above the substrate 1 held by the turntable 2. This splash preventing cover 7 is employed to prevent splashing of the application liquid 3.

A support mechanism 5 supports the splash preventing cover 7. An exhaust hole 8 is provided towards the exterior from the substrate 1 held by the turntable 2. This exhaust hole 8 is connected by a pipe to a ventilating fan 9 which serves as an external device for exhausting air from the interior of the splash preventing cup 6.

An exhaust hole 12 is connected to an external, waste liquid tank 13. This exhaust hole 12 is employed for exhausting an excess of application liquid due to splashing or the like.

The conventional spin coating device as mentioned above is exemplified by the three kinds of structures described below.

A first type of spin coating device is designed in such a manner that the flow B of external air enters only through a gap 11 between the splash preventing cup 6 and the splash preventing cover 7. The air is supplied to a portion in the vicinity of the peripheral edge of the substrate 1, and a downward air current is introduced toward the exhaust hole 8 by the ventilating fan 9.

In a second type of spin coating device, the gap 11 is sealed, so that external air does not enter and is not expelled through the exhaust hole 8. The spin coating device of this type is so designed that the splash preventing cover 7 is opened upon high speed rotation of the substrate or thereafter.

In a third type of-spin coating device, the splash preventing cover 7 is not provided.

Although drying of the application liquid 3 is usually facilitated by external air to form a thick film, in the case of the first and second types of spin coating devices, it is difficult to supply external air to the entire surface area of the substrate other than portions in the vicinity of the peripheral edge of the substrate. Therefore, drying of the application liquid 3 in sections where it is difficult to supply external air is delayed, with the result that the viscosity of the application liquid 3 is degraded and a thin film is undesirably formed.

As opposed to the two types of spin coating devices described above, the third type of spin coating device is not provided with the splash preventing cover 7 so that external air is sufficiently supplied and a film of satisfactory thickness can be formed.

However, the three types of the conventional spin coating devices have the following problems.

The spin coating device of the first type is so constructed that the flow B of external air enters from the gap 11 between the splash preventing cup 6 and the splash preventing cover 7. Therefore, since a large quantity of external air is supplied to portions in the vicinity of the peripheral edges of the substrate 1, an increase in the thickness of the film is liable to be generated in these portions.

On the other hand, in the case of the spin coating devices of the second and third types, since the relative speed of the air current at the outer periphery is higher, an increase in the thickness of the film is apt to occur at the outer periphery of the substrate. As a result, the thickness of the film formed on the substrate is uneven or an air flow C is generated above the substrate 1 and droplets of misty application liquid 3 are attached on the surface of the substrate 1, easily leading to defects in the quality of the substrate. Further, the flow C is difficult to adjust.

SUMMARY OF THE INVENTION

It is a primary object of the present invention to provide a spin coating device for a substrate in which the above mentioned defects and disadvantages of conventional spin coating devices can be substantially eliminated and a uniform thin film can be formed by coating a substrate with an application liquid, significantly improving the quality of the substrate.

This object can be attained by the following improvement according to the present invention, applied to a spin coating device for coating a substrate with an application liquid, comprising:

a turntable for holding and rotating a substrate; application liquid supply means for supplying an application liquid to said substrate; splash preventing means for preventing droplets of said application liquid from splashing, the splash preventing means having an opening portion for circulating external air in an area ranging from the central portion of said substrate which is held by said turntable to a peripheral portion thereof; and exhaust means for exhausting air from within said splash preventing means.

When the spin coating device for a substrate having the above mentioned structure is employed, excellent effects can be obtained such as: the application liquid supply means supplying the application liquid to the substrate rotated by the turntable, at which time the droplets of the application liquid can be prevented from splashing by the splash preventing means; the flow of external air is able to be obtained in the area ranging from the central portion toward the peripheral portions of the substrate held by the turntable through the opening portion of the splash preventing means; and the exhausting means is able to exhaust air in the splash preventing means.

Further, in accordance with the structure of the spin coating device for a substrate of the present invention, since a portion of the splash preventing means facing the substrate which is supported by the turntable is formed in such a manner that it approaches the substrate from the opening portion of the splash preventing means to the peripheral portion of the substrate, the amount of air can be advantageously uniformly supplied to the entire area of the surface of the substrate. More specifically, the speed of the air current over the entire surface of the substrate can be equalized, and accordingly, the flow of external air allows the thickness of the application liquid to become equal, so that droplets of splashing application liquid can be prevented from reattaching to the substrate.

BRIEF DESCRIPTION OF THE DRAWINGS

Other features and advantages of the present invention will be apparent from the following description, with reference to the accompanying drawings, wherein FIG. 1 is a longitudinal section view showing a preferred embodiment of a spin coating device for a substrate according to the present invention;

FIG. 1A is a longitudinal section view showing another embodiment of a spin coating device for a substrate according to the present invention.

DETAILED DESCRIPTION OF THE PREFERRED EMBODIMENT

Figure 2:
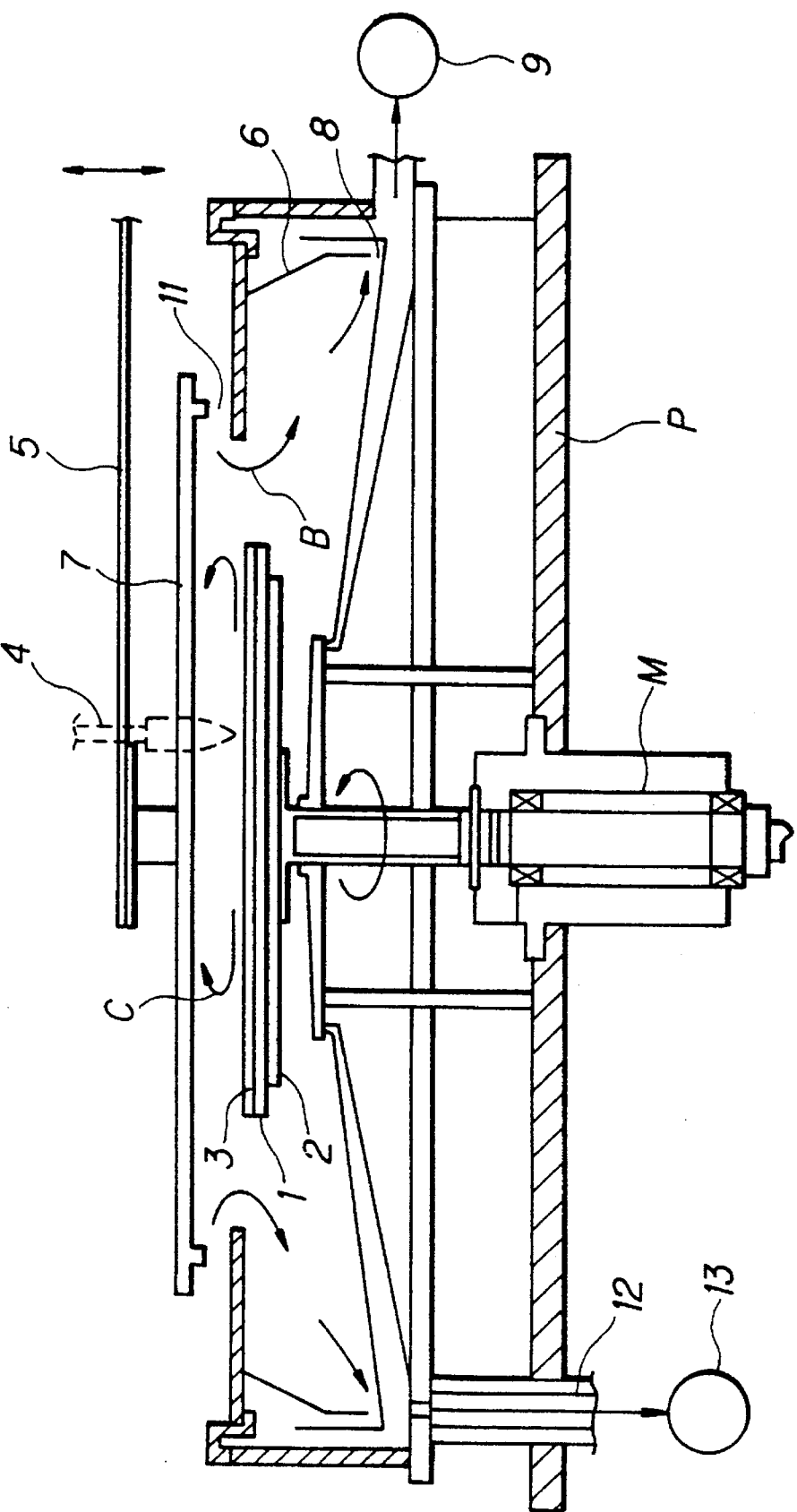
FIG. 2 is a longitudinal section view of a conventional spin coating device for a substrate.

A preferred embodiment of the present invention will now be described in detail, with reference to the accompanying drawing.

Although the description herebelow refers to a preferred embodiment of the invention, and technically preferable limitations are defined, it will be understood that the scope of the present invention shall not be limited thereto unless there is a statement to that effect in the following explanation.

A preferred embodiment of a spin coating device for a substrate is directed to a spin coating device for a substrate in which a uniform thin film is formed by applying an application liquid of relatively low to intermediate viscosity such as polyimide resin solution, liquid dopant, photoresist or the like, to the substrate thereby to form a uniform thin film while a semiconductor substrate, a ceramic substrate, or a glass substrate (merely referred to as a substrate hereafter) is rotated at high speed.

FIG. 1 illustrates a preferred embodiment of a spin coating device for a substrate according to the present invention.

In the drawing, a turntable 2 is employed for holding and rotating a substrate 1. This turntable 2 can be rotated in the direction shown by an arrow R by a motor M. This motor M is attached to a plate P.

An application liquid discharge nozzle 4 is shown by broken lines in FIG. 1. The application liquid discharge nozzle 4 supplies an application liquid 3 to the rotating substrate 1. This application liquid discharge nozzle 4 is provided above the turntable 2. For example, the substrate 1 may be a semiconductor substrate and formed in the shape of a disk.

A splash preventing member 20 includes a splash preventing cup 6 and a splash preventing cover 7.

This splash preventing cup 6 is used for preventing droplets of the application liquid 3 from splashing. The splash preventing cup 6 is arranged at the periphery of the turntable 2, especially in the area corresponding to the peripheral edges of the substrate 1 and the turntable 2.

The splash preventing cover 7 is located above the substrate 1, which is supported by the turntable 2, and so arranged as to face the substrate 1 so that splashing of the application liquid 3 can be prevented.

This splash preventing cover 7 is capable of being opened or closed in the direction of an arrow Z relative to the splash preventing cup 6 by an opening and closing mechanism 40. The opening and closing mechanism 40 is provided with, for example, a mechanism 5 and a drive device 30.

The splash preventing cover 7 is supported by the mechanism 5 of the opening and closing mechanism 40. The drive device 30 and the mechanism 5 can preferably move the splash preventing cover 7 in the direction shown by the arrow Z as mentioned above. Further, the drive device 30 and the mechanism 5 can retract the splash preventing cover 7 to another position (a lateral position in the upper portion) above the turntable 2.

The splash preventing cover 7 is so arranged that it corresponds to the opening portion 6a of the splash preventing cup 6. In the embodiment illustrated in FIG. 1, the size of the opening portion 6a of the splash preventing cup 6 is larger than that of the substrate 1. On the other hand, the size of the splash preventing cover 7 is larger than that of the opening portion 6a.

A hole 10 is formed as an opening portion for obtaining the flow A of external air in the central portion of the splash preventing cover 7. The hole 10 is formed in such a way that the flow A of external air is supplied to the substrate 1 located above the turntable 2.

This hole 10 may preferably be provided with a rectifying member such as mesh or a filter.

The shape of the splash preventing cover 7 has such characteristics as described below.

A bottom surface of the splash preventing cover 7 facing the substrate 1 above the turntable 2 is formed in the shape of an inclined portion 7a.

This inclined portion 7a is so configured as to have an inclination by which this portion 7a approaches the substrate 1 from the hole 10 in the central portion (or the center of rotation of the substrate 1) toward the periphery. In other words, the angle of inclination of the inclined portion 7a is set. This inclined portion 7a is preferably curved as shown in FIG. 1.

As a result of the curved inclined portion 7a being provided on the lower surface of the splash preventing cover, the flow of air can be uniformly supplied over the entire area of the upper surface of the substrate 1.

As shown in FIG. 1, the splash preventing cup 6 is brought into contact with the splash preventing cover 7 thereby to eliminate the gap therebetween. Alternatively, the gap 11, which can also be referred to as the space between the splash preventing cup 6 and the splash preventing cover 7, can be corrected and adjusted, interrupting or adjusting the flow of external air from the gap. Specifically, the drive device 30 is operated so that the mechanism 5 can be moved in the direction of the arrow Z. In this way, the splash preventing cup 6 can come into contact with the splash preventing cover 7, or the clearance between the splash preventing cup 6 and the splash preventing cover 7 can be narrowed.

As stated above, the flow rate of the flow A of external air entering from the gap is cut off or adjusted by removing or adjusting the size of the gap. Accordingly, the flow rate of the flow A of external air supplied from the hole 10 can be adjusted. That is, the flow rate of the flow A of external air supplied from the hole 10 functions as a resistance to the flow of external air entering through the gap. Therefore, the flow A of external air entering from the hole 10 operates as the main air current entering from the outside.

An exhaust hole 8 is located toward the outside from the substrate 1 held by the turntable 2. This exhaust hole 8 is connected by a pipe to a ventilating fan 9, which is an external device, so that it can exhaust air from within the splash preventing cup 6.

A waste liquid exhaust hole 12 is connected to an external, waste liquid tank 13. The waste liquid exhaust hole 12 serves to discharge excess application liquid produced by splashing or the like to the waste liquid tank 13.

Referring to FIG. 1, the flow A of external air substantially uniformly flows in the radial direction along the upper surface of the substrate 1, uniformly flows down from the peripheral edge of the substrate 1, and is exhausted from the exhaust hole 8 by the ventilating fan 9.

The excess of application liquid due to splashing of droplets thereof is discharged from the waste liquid exhaust hole 12 and stored in the waste liquid tank 13.

The position, shape, size, numbers, and so forth, of the hole 10 are associated with adjustment of the flow rate, direction, and so forth, of the flow A of external air. Therefore, it will be noted that they need not be specifically defined herein. They may be determined in accordance with the state of distribution of the film thickness on the substrate 1 at that time.

However, in order to form the film 3 at a uniform thickness over the entire surface of the substrate 1, it is preferable for the hole 10 to be located at exactly the central portion of the splash preventing cover 7. Further, it is preferable for the diameter of the circular hole 10 to be within a range from $\frac{1}{10}$ to $\frac{1}{3}$ of the diameter of the substrate 1.

Also, the inclination of the inclined portion 7a at the bottom surface of the splash preventing cover 7 need not be specifically defined. Accordingly, the inclination may preferably be made to meet the size and the shape of the substrate 1 at that time.

In this case, however, in order to uniformly supply air over the entire upper surface of the substrate 1, it is desired that the distance between the inclined portion 7a in the lower surface of the splash preventing cover 7 and the substrate 1 be, for example, uniformly decreased from the hole 10 of the central portion toward the outside. For example, the inclination is preferably determined in such a manner that, for example, the minimum value of the distance between the inclined portion 7a at the outer periphery of the substrate 1 and the substrate 1 be not more than 90% of the maximum value of the distance between the inclined portion 7a at the inner peripheral portion of the substrate 1.

The operations and effects of the above-mentioned embodiment of the spin coating device will now be described with reference to the drawing.

The application liquid discharge nozzle 4 and the splash preventing cover 7 are initially retracted to an upper and lateral position. Then the substrate 1 is aligned with and set on the turntable 2. The substrate 1 is fixed to and held by the turntable 2.

Air in the splash preventing cup 6 is forcibly exhausted from the exhaust hole 8 by the ventilating fan 9.

A swing arm (not shown) of the application liquid nozzle 4 is operated so that the application liquid discharge nozzle 4 is disposed at a prescribed position (central position) above the substrate 1. After the application liquid 3 is discharged from this application liquid discharge nozzle 4, this swing arm is retracted.

Then, the splash preventing cover 7 is immediately positioned at a portion corresponding to the opening portion 6a of the splash preventing cup 6. A motor M is operated to rotate the turntable 2 at high speed.

In this way, while the substrate rotates, a thin film 3 is formed on the surface of the substrate 1.

Then, excess application liquid 3 or a mist of the application liquid 3 is splashed in droplets from the peripheral edge of the substrate 1 due to centrifugal force arising from the rotation of the substrate 1.

Meanwhile, since the air in the splash preventing cup 6 is forced to be exhausted from the exhaust hole 8 by the ventilating fan 9, the flow A of external air entering from the hole 10 of the splash preventing cover 7 flows in the radial direction along the inclination of the inclined portion 7a corresponding to the upper surface of the substrate 1. Then, the flow A of external air uniformly flows down from the peripheral edge of the substrate 1 and is discharged from the exhaust hole 8.

As mentioned above, the excess application liquid 3 splashing in droplets does not re-adhere to the surface of the substrate 1 because of the flow A of the above-mentioned air current and is stored in the waste liquid tank 13 via the waste liquid exhaust hole 12.

By appropriately setting the inclination of the inclined portion 7a in the bottom surface of the splash preventing cover 7, the amount of air can be uniformly supplied across the entire area of the upper surface of the substrate 1 and the thickness of the film on the substrate can be further uniformly adjusted.

Specifically stated, since the area in the outer peripheral portion or peripheral portion of the substrate 1 is larger than that in the inner peripheral portion of the substrate 1, the relative speed of the air current in the former portion is decreased.

Therefore, the inclination of the inclined portion 7a at the bottom surface of the splash preventing cover 7 is appropriately set, so that the relative speed of the air current at the outer peripheral portion of the substrate 1 is increased. In this state, the speed of the air current throughout the entire area of the upper surface of the substrate 1 can be equalized.

In accordance with the embodiment of the present invention, since the lower surface of the splash preventing cover 7 is formed so as to be inclined, lingering of the air current at the upper portion of the substrate 1 can be substantially prevented, uniform drying can be realized and splashing droplets of the application liquid can be completely prevented from reattaching to the surface of the substrate 1.

Further, since the inclination of the configuration of the lower surface of the splash preventing cover 7 is arbitrarily set, the amount of air can be uniformly supplied throughout the entire area of the upper surface of the substrate 1. The thickness of a film applied to the substrate can therefore be uniformly formed.

Accordingly, the quality of the substrate can be further improved.

Although a preferred embodiment of the present invention has been disclosed above, various modifications of the invention may become apparent to those skilled in the art after having read the foregoing description. Accordingly, it is intended that the description not be considered limited to the above description. Although the above embodiment illustrates an example of a spin coating device for applying an application liquid to a semiconductor substrate, it can also be applied to a case in which a uniform thin film is formed on a substrate by applying an application liquid of relatively low viscosity or intermediate viscosity such as polyimide resin solution, liquid dopant photoresist or the like while a ceramic substrate, glass substrate or the like is rotated at high speed.

Further, it should be noted that the inclined portion 7a illustrated in FIG. 1 is not limited to one formed in a curved line. The inclined portion 7a may be so configured as to be linear having an inclination capable of being contiguous to the substrate 1 from the hole 10 of the central portion toward the outside.

As stated in the foregoing description, according to the spin coating device for a substrate, a uniform thin film can be formed by applying an application liquid onto the substrate, further contributing to improvement of the quality of the substrate.

What is claimed is:

1. A spin coating device for applying an application liquid to a substrate, comprising:

a turntable for holding and rotating a substrate;

application liquid supply means for supplying an application liquid to said substrate;

splash preventing means for preventing droplets of said application liquid from splashing on said substrate, said splash preventing means having an opening portion for admitting external air only above a central portion of said substrate and for circulating said external air in an area ranging from said central portion of said substrate to a peripheral portion of said substrate, wherein said circulating external air is circulated on the same side of said substrate as said application liquid means supplies said application liquid; and exhaust means for exhausting air from within said splash preventing means.

2. A spin coating device according to claim 1, wherein a portion of said splash preventing means faces said substrate and is so formed as to gradually approach said substrate from said opening portion toward the peripheral portion of said substrate.

3. A spin coating device according to claim 1, wherein said splash preventing means includes a rectifying member for adjusting the flow rate of external air in said opening portion.

4. A spin coating device according to claim 1, wherein said splash preventing means includes a splash preventing cover substantially in the center of which is formed said opening portion and a portion of said splash preventing cover faces said substrate wherein said splash preventing cover is so formed as to gradually approach said substrate from said opening portion to the peripheral portion of said substrate.

5. A spin coating device according to claim 1, wherein said splash preventing means includes a splash preventing cup surrounding said turntable and a splash preventing cover substantially in the center of which is formed said opening portion, wherein said splash preventing cover faces said substrate which is held by said turntable.

6. A spin coating device according to claim 2, wherein said portion facing the substrate is curved.

7. A spin coating device according to claim 2, wherein said portion facing the substrate is linear.

8. A spin coating device according to claim 5, further comprising a driving means for driving said splash preventing cover and adjusting the size of a gap between said splash preventing cup and said splash preventing cover.

9. A spin coating device according to claim 5, wherein said splash preventing cover is in contact with said splash preventing cup.

10. A spin coating device for a substrate for applying an application liquid on a substrate to form a substantially uniform thin film on the substrate, comprising:

a turntable for holding and rotating the substrate about a center;

an application liquid discharge nozzle for supplying the application liquid to the rotating substrate;

a splash preventing member, including a splash preventing cup and a splash preventing cover for preventing droplets of the application liquid from splashing, the splash preventing cup arranged at a periphery of the turntable in an area corresponding to peripheral edges of the substrate and the turntable, the splash preventing cover located above the substrate and arranged to face the substrate so that splashing of the application liquid is prevented; and an opening and closing mechanism for opening and closing the splash preventing cup;

wherein the splash preventing cover has a hole for obtaining a flow of external air in a central portion of the splash preventing cover, the hole being formed so that the flow of external air is supplied to the substrate located above the turntable, and a bottom surface of the splash preventing cover faces the substrate, is above the turntable and is formed with an inclined portion which is configured to have an inclination which approaches the substrate from the hole in the central portion toward the periphery of the substrate.

11. The spin coating device according to claim 10 wherein the inclined portion is curved so that the flow of air is substantially uniformly supplied over the entire area of the upper surface of the substrate.

12. The spin coating device according to claim 10 wherein the splash preventing cup and the splash preventing cover define a gap therebetween, the gap being adjustable to control the flow of external air from the gap.

13. The spin coating device according to claim 12 further including an exhaust hole located toward the outside from the substrate to exhaust air from within the splash preventing cup.

14. A spin coating device having means for applying an application liquid on a substrate to form a substantially uniform thin film on the substrate, said applying means comprising:

means, including a turntable having a periphery, for holding and rotating the substrate about a center;

means, including an application liquid discharge nozzle, for supplying the application liquid to the rotating substrate;

means, including a splash preventing member, a splash preventing cup and a splash preventing cover, for preventing droplets of the application liquid from splashing, the splash preventing cup arranged at a periphery of the turntable in an area corresponding to peripheral edges of the substrate and the turntable, the splash preventing cover located above the substrate and arranged to face the substrate so that splashing of the application liquid can be prevented; and means for opening and closing the splash preventing cup;

wherein the splash preventing cover has a hole for obtaining a flow of external air in a central portion of the splash preventing cover, the hole being formed so that the flow of external air is supplied to the substrate located above the turntable, and a bottom surface of the splash preventing cover faces the substrate, is above the turntable and is formed with an inclined portion which is configured to have an inclination which approaches the substrate from the hole in the central portion toward the periphery of the substrate.

15. The spin coating device according to claim 14 wherein the inclined portion is curved so that the flow of air is substantially uniformly supplied over the entire area of the upper surface of the substrate.

16. The spin coating device according to claim 15 wherein the splash preventing cup and the splash preventing cover define a gap therebetween, the gap being adjustable to control the flow of external air from the gap.

17. The spin coating device according to claim 14 further including an exhaust hole located toward the outside from the substrate to exhaust air from within the splash preventing cup.

18. The spin coating device according to claim 14 wherein for the claimed combination, the flow of external air substantially uniformly flows in a radial direction along an upper surface of the substrate, substantially uniformly flows down from the peripheral edge of the substrate, and is exhausted from the exhaust hole.

* * * * *

UNITED STATES PATENT AND TRADEMARK OFFICE
CERTIFICATE OF CORRECTION

PATENT NO. : 5,591,264
DATED : January 7, 1997
INVENTOR(S) : Emi Sugimoto, et al It is certified that error appears in the above-indentified patent and that said Letters Patent is hereby corrected as shown below:

On the title page item [73], should read

-- Sony Corporation, JAPAN and Sony Disc Technology Inc., JAPAN --

Signed and Sealed this

Tenth Day of June, 1997

Attest:

BRUCE LEHMAN

Attesting Officer

Commissioner of Patents and Trademarks